United States Patent
Tai et al.

(12) 
(10) Patent No.: US 6,277,218 B1
(45) Date of Patent: Aug. 21, 2001

(54) PROBE CARD TREATMENT METHOD

(75) Inventors: Chin-Fa Tai, Hsinchu Hsien; Cindy Chen, Taipei Hsien; Kelly Liao, Taoyuan Hsien, all of (TW)

(73) Assignees: Promos Technologies Inc.; Mosel Vitelic Inc., both of Hsinchu (TW); Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/418,199

(22) Filed: Oct. 13, 1999

(51) Int. Cl.[7] .................................................. C21D 9/26
(52) U.S. Cl. ......................... 148/516; 148/678; 148/679
(58) Field of Search .................................. 148/516, 678, 148/679, 686

(56) References Cited

FOREIGN PATENT DOCUMENTS 55-133550 * 10/1980 (JP).
58-20339 * 2/1983 (JP).

* cited by examiner

*Primary Examiner*—George Wyszomierski
(74) *Attorney, Agent, or Firm*—Jiawei Huang; J. C. Patents

(57) ABSTRACT

A probe card treatment method, which is applicable on a probe card comprising multiple probe needles, is described. A thermal treatment is conducted on the probe card by placing the probe card in a closed heating device, wherein the temperature of the thermal treatment is enough to restore the elasticity and the planarity of the probe needles without softening the probe card. The probe card and the probe needles thereon are then rapidly cooled by cool air such that the elasticity of the probe needles is retained and the lifetime of the probe needles is extended.

7 Claims, 3 Drawing Sheets

PROBE CARD TREATMENT METHOD

BACKGROUND OF THE INVENTION

1. Field of the Invention

This invention relates to a treatment method for a probe card. More particularly, this invention relates to treatment method for a cantilever probe card, which improves of the elasticity and the planarity of a cantilever probe card.

2. Description of the Related Art

After the completion of the manufacturing process of an integrate circuit (IC), the circuit fabricated on a wafer are normally tested using a multiple-point probe card. A probe card is a printed circuit board that can be used in conjunction with testing equipment to test the electrical properties of semiconductor chip devices. A typical probe card contains a plurality of probe needles. During the testing procedure, the probe needle is brought into contact (a touchdown) with the bonding pad of the test key, located on the individual circuit. The probe needles are typically applied to the test key of the wafer with sufficient force to ensure a proper contact with the bonding pad. As a result, the probe needle scratches the surface of the bonding pad, and the scratch mark on the bonding pad is used to evaluate the quality of the test. When a scratch mark is too big, the vertical position or the height of the probe needle is adjusted to maintain the quality of the test.

The cantilever probe card is one type of the probe cards used to evaluate the yield of IC devices. During the touchdown process, the cantilever probe card is subjected to an external stress. In the mean time, an internal stress and moment are generated in the probe needle to maintain a static balance of the probe needle. Since the probe needle is not an isotropic material, the internal stress is not completely dissipated even after the external stress is removed. After thousands of touchdown processes, the residual stress gradually accumulates in the probe needle, causing the probe needle on the probe card to lose its elasticity. Consequently, the position of the probe needle is shifted during a touchdown process. Furthermore, the residual stresses in different probe needles are different; the probe needles on the probe card therefore do not return to the same planar surface by the elasticity of the probe needles. A reduction of the planarity of the probe needles is hence resulted.

A method to restore the shifted position and the reduction of planarity of the probe needle is to adjust the test parameters of the probe needles. For example, the preset height of the probe is lowered from 55 microns above the common IC plane to 45 microns so that the test can be continued without the probe needle recovering its original elasticity. However, after the test is continued for a period of time, the probe needle suffers fatigue, and the problems of the shifted position and the reduction of the planarity of the probe needle will occur repeatedly. Furthermore, in order to adjust the position of the probe needles, an operator is required to manually adjust the probe needle to the proper position. This approach not only is time consuming, but also damages the probe card easily. Replacement with a new probe card is then needed, leading to an increase of the production cost.

In addition, the border of the wafer is usually curved, which easily causes the probe needle to bend. This type of damage to the probe needle also requires replacement with a new probe card, which again leads to an increase of the production cost.

SUMMARY OF THE INVENTION

In the light of the foregoing, the present invention provides a treatment method for the probe card, which is applicable to a probe card having multiple probe needles. The treatment method includes subjecting the probe card to a thermal treatment in a closed heating device. The temperature of the thermal treatment must be high enough to restore the elasticity and the planarity of the probe needles yet not soften the cantilevered device on the probe card. After the thermal treatment, the probe card with the probe needles thereon is rapidly cooled by exposure to cool air.

The present invention employs a thermal treatment to release the residual stress accumulated in the probe needle in order to restore the elasticity and the planarity of the probe needle. The probe needle, which is subjected to a rapid cooling treatment, retains the elastic property restored in the thermal process. The lifetime of the probe needle is thereby extended.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1:
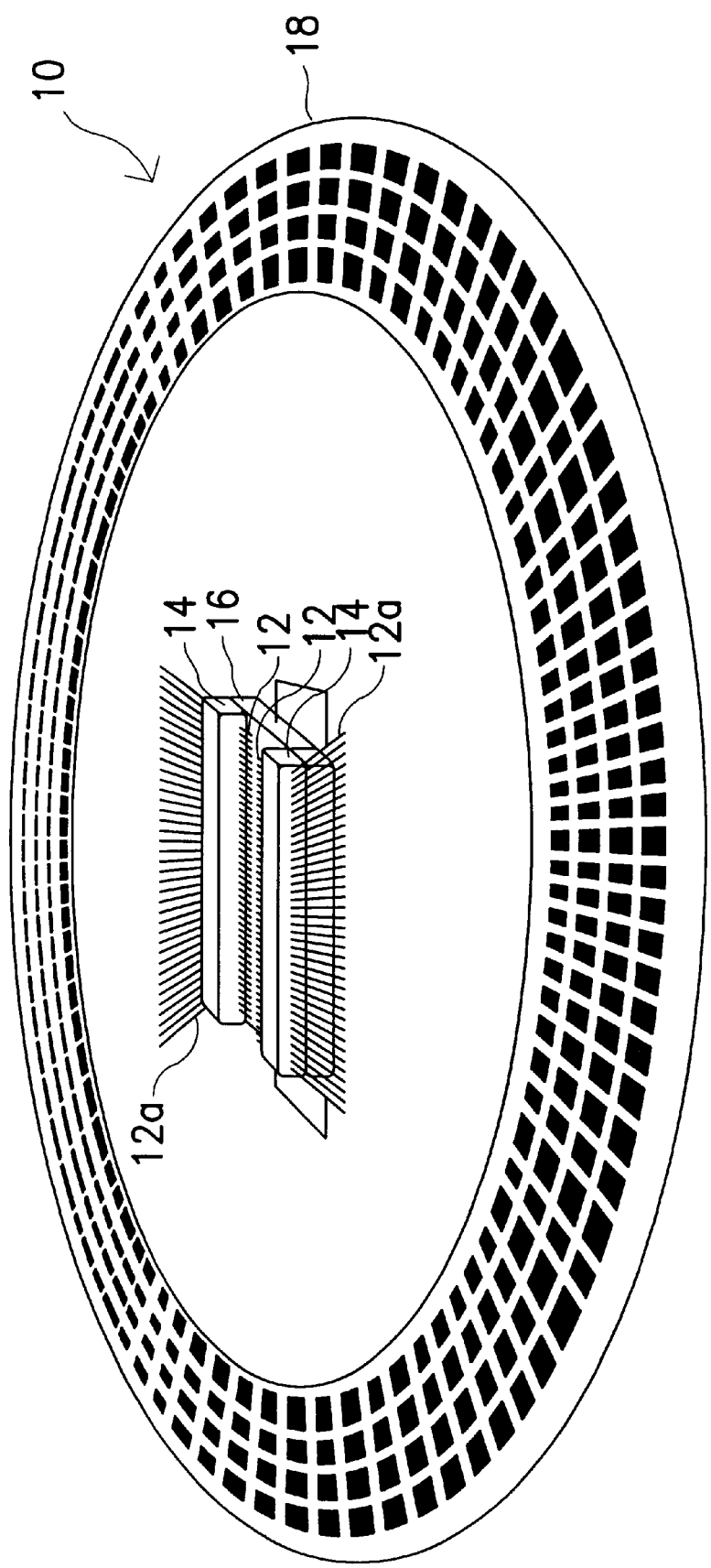
FIG. 1 is a schematic, top view of a cantilever probe card.

In order to inspect a large number of chips on an integrated circuit (IC), a probe card containing a plurality of probe needles is required. For example, an IC with a line width of 0.25 microns comprises 46 test points. If a probe card can concurrently inspect 3×10 dice, a probe card having 1380 of the probe needles are needed to inspect this type of IC with multiple dice. FIG. 1 is a schematic diagram showing the structure of a cantilever probe card 10, wherein the probe needles are fixed by a cantilever device 14 onto a ceramic structure 16. The ceramic structure 16 is further fixed on a printed circuit board (PCB) 18, where the tips 12a of the probe needles 12 are electrically connected to the PCB 18. When the probe card 10 is conducting a test on a wafer, all the probe needles must be accurately positioned. If a plurality of the probe needles 12 on a probe card 10 lose their elasticity, the planarization of the probe needles is thus compromised. In another words, not all the probe needle tips 12a lie in a same planar surface parallel to the common IC plane. Manually adjusting the position of the probe needles 12 is not only time consuming and labor-intensive, but the probe card is easily damaged during the adjusting process. Replacement with a new probe card is then needed.

According to the preferred embodiment of the present invention, a treatment method for a probe card is provided in which the probe card and the probe needles thereon are subjected to a thermal treatment, followed by a rapid cooling treatment to restore the elasticity of the probe needles. Consequently, the probe needles can land on the proper positions during a touchdown process in which the planarity of the probe needles is preserved and the lifetime of the probe needles is extended.

Figure 2:
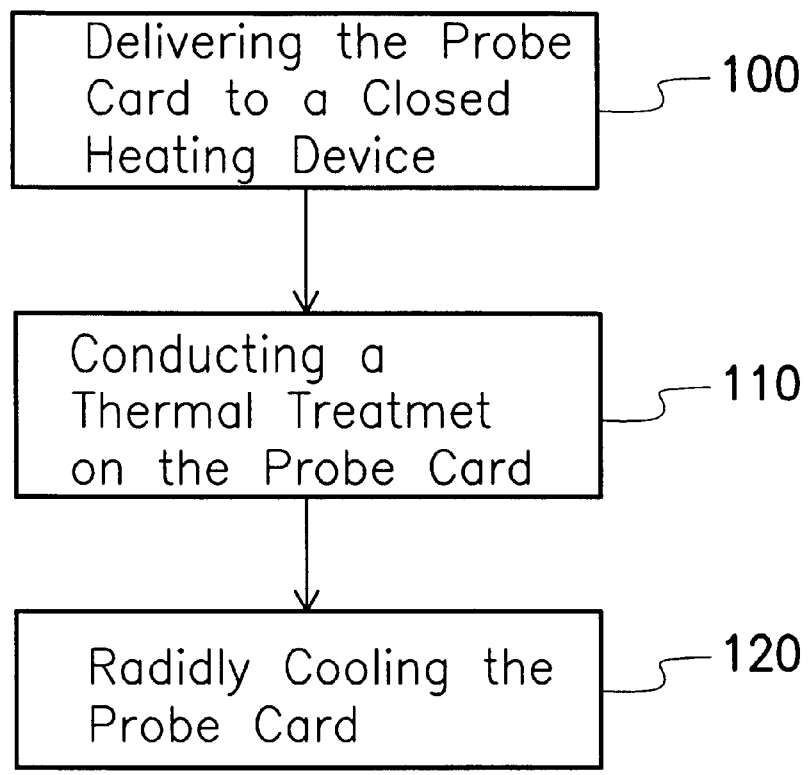
FIG. 2 is a flow diagram illustrating the progression of the treatment according to the preferred embodiment of the present invention on a probe card.

FIG. 2 is a flow diagram showing the progression of the probe card treatment according to the preferred embodiment of the present invention. As shown in step 100 of FIG. 2, a probe card comprising a plurality of probe needles, for example, a cantilever probe card, is placed in a closed heating device such as a drying oven (Step 100). The power for the drying oven is about 2200 watts, and the temperature range for the drying oven is about 0 degrees Celsius to 200 degrees Celsius.

Figure 3:
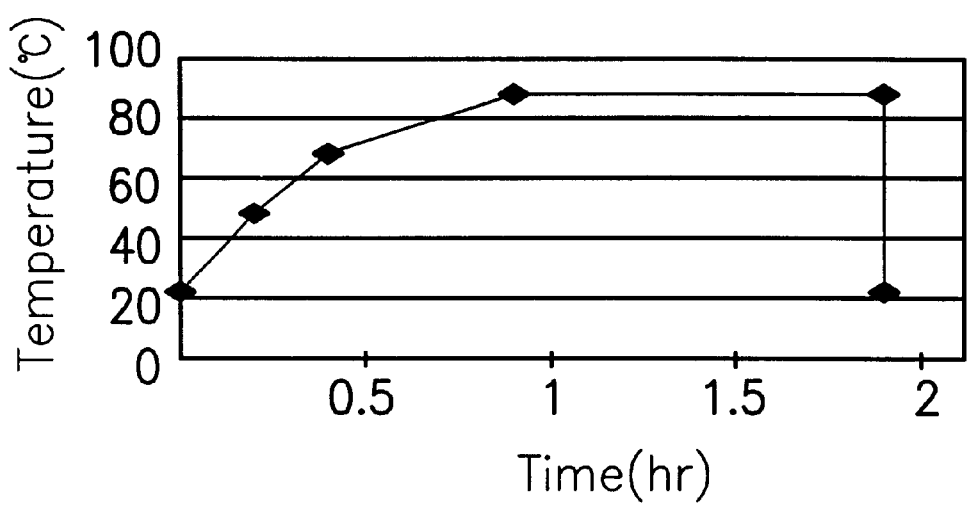
FIG. 3 is temperature curve showing the stepwise temperature rising behavior of the thermal treatment on the probe card as a function time.

A thermal treatment (Step 110) is then conducted on the probe card 10 (as in FIG. 1) including the probe needles 12 (as in FIG. 1) thereon in the closed heating device to release the residual stress accumulated in the probe needles and to restore the elasticity of the probe needles. The temperature range of the thermal treatment must be high enough to provide the restoration of the elasticity and the planarity of the probe needles 12 (as in FIG. 1). If the probe needles 12 (as in FIG. 1), are cantilevered with a device 14 made of, for example, epoxy, which has a softening temperature of about 120 degrees Celsius, the temperature range for the thermal treatment must not be near the temperature where the softening of the probe card occurs. For an epoxy cantilever device 14, the temperature range of the thermal treatment according to the preferred embodiment of the present invention is about 60 degrees Celsius to about 100 degrees Celsius. The temperature in the closed heating device is ramped in a stepwise manner as illustrated in FIG. 3, to complete the thermal treatment. For example, the first step is to increase the temperature from a room condition of about 22 degrees Celsius to about 48 degrees Celsius in 12 minutes. In the second step, the temperature is raised from 48 degrees Celsius to 68 degrees Celsius in 12 minutes. The third step includes raising the temperature from 68 degrees Celsius to 88 degrees Celsius in 30 minutes. The temperature is then maintained at 88 degrees Celsius for 60 minutes.

After the thermal treatment, a rapid cooling treatment (Step 120) is conducted on the probe card 10 (as shown in FIG. 1) by, for example, opening up the closed heating device and allowing the entry of cool air to rapidly cool down the temperature of the probe card 10 (as shown in FIG. 1). The characteristic of the probe needles 12 (as shown in FIG. 1) of the probe card 10 (as shown in FIG. 1) at the elevated temperature are retained with the rapid cooling treatment (step 120). As a result, the residual stress accumulated in the probe needles is released and the probe elasticity is restored.

Figure 4:
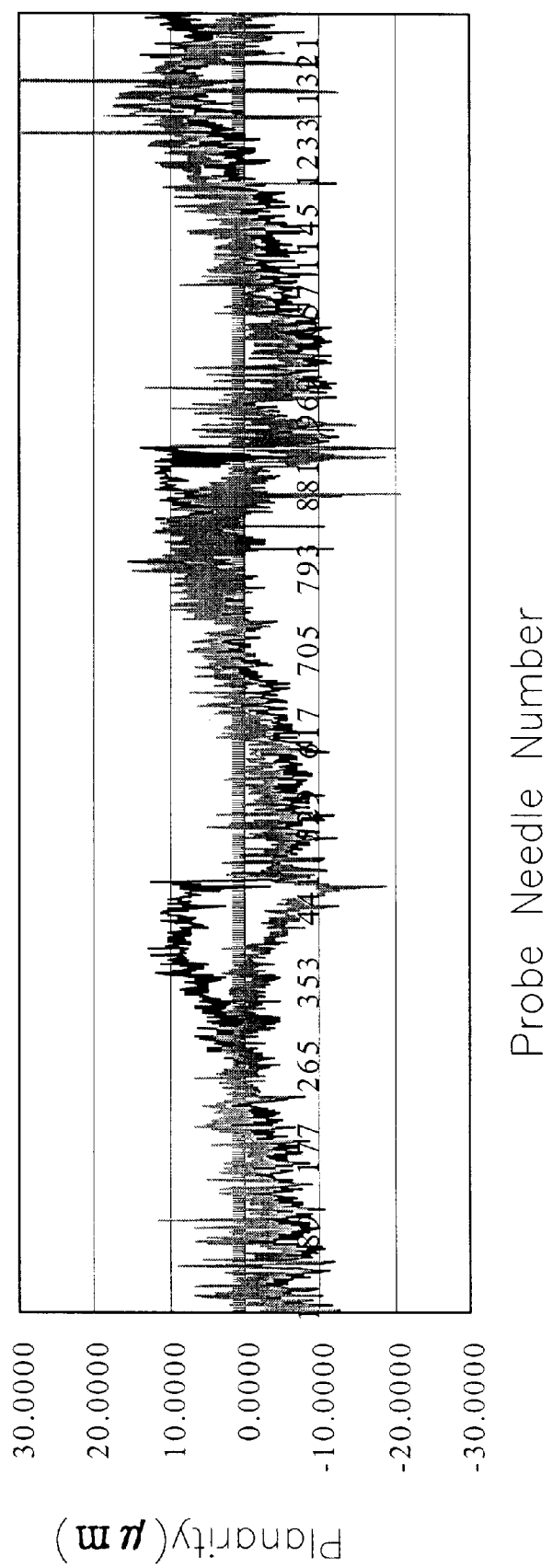
FIG. 4 is a test result showing the differences of the planarity of the probe needles before and after the probe card treatment.

FIG. 4 is the test results showing the planarity of the probe needles before and after the thermal and rapid cooling treatments. The dark line 300 represents the test result for the probe needle before the thermal treatment, and the gray line 310 represents the test result for the probe needles after the thermal treatment. The y-axis represents the deviation of the probe height after a touchdown process, which correlates to the planarity of the probe needles. The x-axis represents the probe number. As shown in FIG. 4, the height of the probe needle before any thermal treatment deviates within the range of ±13 microns. The deviation of the probe height, however, approaches 0 microns as indicated by the gray line after the thermal treatment. After subjecting the probe needles to the thermal and the rapid cooling treatments, the elasticity of the probe needles are restored such that the deviation of the probe height or the planarity of the probe needle is restored to about 4 to 5 microns. Since the elasticity of the probe needle is restored, the planarity is also improved. The lifetime of the probe needles is thereby extended by about 130% to about 150% of that of the original probe.

In addition, a probe needle, which is damaged by an abnormal external stress, can use the treatment method disclosed in the above to restore the elasticity of the probe needle after the position of the probe needle is properly adjusted. Furthermore, the undamaged probe needle will not lose its elastic property or be damaged by the probe card treatment process.

The treatment method according to the preferred embodiment of the present invention can be conducted after the position of the probe needle on the probe card is shifted or after a fixed number of probe needle uses. For example, the treatment can be applied to effectively extend the lifetime of the probe needle after the probe needle is used about 10000 times.

The present invention provides a treatment method in which the residual stress accumulated in the probe needle is released to restore the elasticity of the probe needle without inducing additional damage to the probe. Thus, the probe card is maintained in a stable condition to ensure the quality of the test to be conducted on the fabricated IC and to extend the lifetime of the probe card to lower the operating time and cost.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A probe card treatment method, which is applicable to a probe card comprising a plurality of probe needles, the method comprising the steps of:

conducting a thermal treatment on the probe needles, wherein the temperature of the thermal treatment is about 60 degrees Celsius to about 100 degrees Celsius; and rapidly cooling the probe needles.

2. The probe card treatment method according to claim 1, wherein the step of rapidly cooling the probe needles includes using cool air.

3. A probe card treatment method, which is applicable to a cantilever probe card comprising of plurality of probe needles, the treatment method comprising the steps of:

conducting a thermal treatment on the probe needles, wherein the thermal treatment does not soften the cantilever probe card and a temperature of the thermal treatment is about 60 degrees Celsius to about 100 degrees Celsius; and rapidly cooling the probe needles to room temperature.

4. A probe card treatment method, which is applicable to a cantilever probe card, wherein probe needles are fixed on the cantilever probe card by epoxy, the method comprising the steps of:

delivering the cantilever probe card to a closed heating device;

conducting a thermal treatment on the probe card, wherein a temperature of the thermal treatment is not enough to soften the epoxy but is enough to restore elasticity and planarity of the probe needles; and sending a cool air into the heating device to rapidly cool the probe needles to room temperature.

5. The probe card treatment method according to claim 4, wherein a temperature for the thermal treatment is about 60 degrees Celsius to about 100 degrees Celsius.

6. The probe card treatment method according to claim 4, wherein the power for the closed heating device is about 2200 watts, and the temperature is about zero degree Celsius to about 200 degree Celsius.

7. The probe card treatment method according to claim 4, wherein the thermal treatment is a stepwise temperature ramping process, the process including:

increasing the temperature from 22 degrees Celsius to 48 degrees Celsius in 12 minutes;

increasing the temperature from 48 degrees Celsius to 68 degrees Celsius in 12 minutes;

increasing the temperature from 68 degrees Celsius to 88 degrees Celsius in 30 minutes; and maintaining the 88 degrees Celsius temperature for 60 minutes.

* * * * *